United States Patent [19]

Watanabe et al.

[11] 4,217,407
[45] Aug. 12, 1980

[54] LIGHT-SENSITIVE O-QUINONE DIAZIDE CONTAINING COPYING MATERIAL

[75] Inventors: Masaru Watanabe; Tadao Yoyama; Azusa Ohashi, all of Odawara, Japan

[73] Assignee: Fuji Photo Film Co., Ltd., Minami-ashigara, Japan

[21] Appl. No.: 746,555

[22] Filed: Dec. 1, 1976

Related U.S. Application Data

[63] Continuation of Ser. No. 474,465, May 29, 1974, abandoned.

[30] Foreign Application Priority Data

May 29, 1973 [JP] Japan ................... 48-60074

[51] Int. Cl.$^2$ .................... G03C 1/60; G03C 1/76
[52] U.S. Cl. .................... 430/166; 430/145; 430/190; 430/192; 430/294; 430/302; 430/326; 430/496
[58] Field of Search .................. 96/91 D, 75, 33, 36, 96/36.2, 36.3, 49

[56] References Cited

U.S. PATENT DOCUMENTS

| | | | |
|---|---|---|---|
| 3,046,131 | 7/1962 | Schmidt et al. | 96/75 |
| 3,130,049 | 4/1964 | Neugebauer et al. | 96/91 D |
| 3,136,637 | 6/1964 | Larson | 96/33 |
| 3,211,553 | 10/1965 | Ito | 96/75 |
| 3,231,377 | 1/1966 | Dickinson et al. | 96/75 |
| 3,264,104 | 8/1966 | Reichel | 96/91 D |
| 3,544,317 | 12/1970 | Yonezawa et al. | 96/33 |
| 3,586,507 | 6/1971 | Burnett | 96/91 D |
| 3,635,709 | 1/1972 | Kobayashi | 96/91 D |
| 3,649,283 | 3/1972 | Christensen et al. | 96/75 |
| 3,652,272 | 3/1972 | Thomas | 96/75 |
| 3,660,097 | 5/1972 | Mainthia | 96/75 |
| 3,677,178 | 7/1972 | Gipe | 96/75 |

Primary Examiner—Charles L. Bowers
Attorney, Agent, or Firm—Sughrue, Rothwell, Mion, Zinn and Macpeak

[57] ABSTRACT

A light-sensitive copying material comprising at least two organic coating layers on a support, at least one of the coating layers being a light-sensitive layer which comprises an O-quinone diazide compound whose alkali solubility is increased by irradiation with active rays.

9 Claims, 7 Drawing Figures

LIGHT-SENSITIVE O-QUINONE DIAZIDE CONTAINING COPYING MATERIAL

This is a continuation of application Ser. No. 474,465, filed May 29, 1974, now abandoned.

BACKGROUND OF THE INVENTION

1. Field of the Invention

This invention relates to a light-sensitive copying material containing an O-quinone diazide compound as a light-sensitive component.

2. Description of the Prior Art

It is known that O-quinone diazide compounds decompose at the diazo group upon radiation with active rays to become carboxyl group-bearing compounds. When a copying layer containing an O-quinone diazide compound is imagewise exposed and then treated with an alkaline developer, therefore, the exposed area is removed and the non-exposed area remains as an image. Accordingly, an O-quinone diazide compound has lately become noted as a light-sensitive component of the so-called positive-positive type, in particular, as a light-sensitive copying composition for a printing original or as a photoresist composition for photo-etching, for example, as disclosed in U.S. Pat. No. 3,181,461. These compositions comprise generally not only an O-quinone diazide compound but also an alkali-soluble resin such as a phenol-formaldehyde resin and a styrene-maleic anhydride copolymer to reinforce the image strength and to increase the film-forming properties, and can preferably be used in the form of a uniform composition, in addition, with additives such as dyes and plasticizers.

However, the O-quinone diazide-containing light-sensitive material of the prior art has the disadvantage that a considerable thickness, for example, 0.5 to 10 microns is necessary in order to obtain a sufficient image strength and thus a large amount of O-quinone diazide compound must be used. As a result the light sensitivity is low as a copying layer. Furthermore, the resin for increasing the image strength should be miscible with O-quinone diazide compounds and only a narrow selection of materials is suitable. Therefore, the reinforcing of an image can not be advantageously carried out.

SUMMARY OF THE INVENTION

Efforts to overcome these disadvantages have been made and, consequently, it has been found that the above described problems can be solved by laminating a support member with a plurality of organic coating layers, at least one layer of which comprises an O-quinone diazide compound.

That is to say, the present invention provides a light-sensitive copying material comprising at least two organic coating layers on a support, at least one of the coating layers being a light-sensitive layer which comprises an O-quinone diazide and whose solubility in an alkaline solution is increased upon irradiation of active rays.

BRIEF DESCRIPTION OF THE ACCOMPANYING DRAWINGS

DETAILED DESCRIPTION OF THE INVENTION

The layer structure of the light-sensitive copying material according to the invention can be roughly classified into two types. Each of the layer structures and a method of forming an image using the light-sensitive copying material will now be illustrated with reference to the accompanying drawings.

Figure 1A:
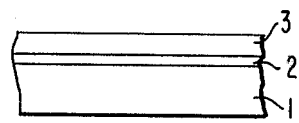
FIGS. 1a to 1c are a cross sectional view of one embodiment of the light-sensitive copying material of the invention.
Figure 1B:
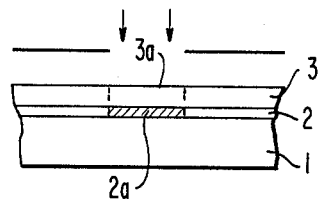
Figure 1C:
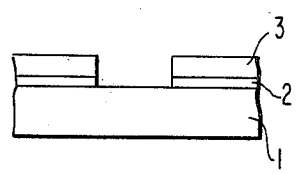

FIG. 1a is a cross sectional view of a first layer structure of the light-sensitive copying material according to the invention, in which a light-sensitive organic coating layer 2 of an O-quinone diazide compound and an organic coating layer 3 different from layer 2 are provided in order on a support member 1. The above described organic coating layer has the property that it is barely soluble in the developer used after exposure and permeable to the developer employed. In FIG. 1b, the light-sensitive copying material of FIG. 1a is exposed to active rays through an original and thus the exposed area 2a of the organic coating layer 2 is rendered alkali-soluble. When this exposed light-sensitive copying material is treated with an alkaline solution, the alkaline solution permeates the organic coating layer 3 and dissolves the organic coating layer 2a and it is completely removed with the organic coating layer 3a. Then, the support 1 is exposed and an image is formed as shown in FIG. 1c.

Figure 2A:
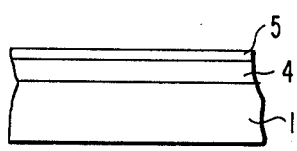
FIGS. 2a to 2c are a cross sectional view of a copying material in the main steps of forming an image.
Figure 2B:
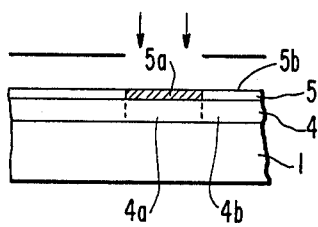
Figure 2C:
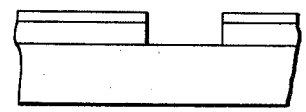

FIG. 2a is a cross sectional view of a second layer structure of the light-sensitive copying material according to the invention, in which an organic coating layer 4 and a light-sensitive organic coating layer 5 of an O-quinone diazide compound are provided in order on a support member 1. In this case, the organic coating layer 4 is dissolved in or swelled by the developer applied after exposure and readily stripped. In FIG. 2b, the light-sensitive copying material of FIG. 2a is exposed to active rays through an original and thus the exposed area 5a of organic coating layer 5 is rendered alkali-soluble. When this exposed light-sensitive copying material is treated with an alkaline developer, the organic coating layer 5a is dissolved and removed and then the lower organic coating layer 4a is also removed, with support 1 thus being exposed. On the other hand, the non-exposed area 5b is not removed by an alkaline developer, and the lower organic coating layer 4b is protected from the developer and remains as it is, thus forming an image as shown in FIG. 2c.

Figure 3:
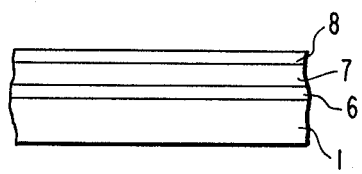
FIG. 3 is a cross sectional view of another embodiment of the light-sensitive copying material of the invention.

FIG. 3 shows a cross sectional view of another layer structure of the light-sensitive copying material according to the invention, in which a light-sensitive organic coating layer 6 of an O-quinone diazide compound, an organic coating layer 7 and a light-sensitive organic coating layer 8 of an O-quinone diazide compound are in order provided on a support 1. In this layer structure, the organic coating layer 7 is permeable to an alkaline developer or is dissolved in or swelled by an alkaline developer.

Suitable supports of the invention which can be used are metal sheets such as aluminum or aluminum alloy sheets, zinc sheets and copper sheets, nitrocellulose films, cellulose diacetate films, cellulose triacetate films, cellulose butyrate films, cellulose acetate butyrate films, polyethylene terephthalate films, polystyrene films, polycarbonate films, polyethylene films, polypropylene films, papers, polyethylene- or polystyrene-laminated papers and glass sheets. Where the light-sensitive copying material of the invention is used as a light-sensitive lithographic printing plate, in particular, the surface of a support should be hydrophilic. In this case, an aluminum sheet is most preferably used as the support, which is preferably surface treated by sand blasting, with a phosphate or potassium fluozirconate or by anodic oxidation. Furthermore, an aluminum sheet subjected to a treatment with an aqueous solution of sodium silicate after sand blasting as described in U.S. Pat. No. 2,714,066 and an aluminum sheet subjected to an anodic oxidation treatment and then to a treatment with an aqueous solution of an alkali metal silicate as described in U.S Pat. No. 3,181,461 are preferably used. The above described anodic oxidation treatment is, for example, carried out by passing an electric current through an aluminum sheet as anode in an electrolyte of one or more of aqueous or non-aqueous solutions of inorganic acids such as phosphoric acid, chromic acid, sulfuric acid and boric acid and organic acids such as oxalic acid and sulfamic acid.

On the other hand, the O-quinone diazide compound of the invention can be selected from a great number of compounds of various structures having at least one O-quinone diazide group, in which the alkali-solubility is increased upon irradiation with active rays. Such O-quinone diazide compounds are described in detail in J. Kosar, Light-Sensitive Systems, p. 339-352, John Wiley & Sons, Inc., which can be used in the present invention. In particular, various aromatic polyhydroxy compounds and O-quinone diazide sulfonic acid esters are preferred. Illustrative of the aromatic polyhydroxy compounds are hydroquinone, catechol, 2,2'-dihydroxybiphenyl, 4,4'-dihydroxybiphenyl, 4,4'-dihydroxydiphenyl ether, 4,4'-dihydroxydiphenyl sulfide, 4,4'-dihydroxydiphenyl sulfone, 4,4'-dihydroxydiphenylmethane, bisphenol A, 1,8-dihydroxynaphthalene, 2,7-dihydroxynaphthalene, 1,4-dihydroxynaphthalene, 2,3-dihydroxynaphthalene, 2,2'-dihydroxy-1,1'-dinaphthylmethane, 4,4'-dihydroxybenzophenone, $\alpha,\beta$-bis-(4-hydroxyphenyl)ethane, 1,4-dihydroxyanthraquinone, 2,7-dihydroxyfluorene, pyrogallol, methyl gallate, 2,2',4,4'-tetrahydroxybiphenyl and tetrahydroxybenzoquinone.

Typical examples of aromatic polyhydroxy compounds and O-quinone diazide sulfonic acid esters are 2,2'-dihydroxydiphenyl-bis-(naphthoquinone-1,2-diazide-5-sulfonic acid ester), 2,3,4-trioxybenzophenone-bis-(naphthoquinone-1,2-diazide-5-sulfonic acid ester), 2,7-dihydroxynaphthalene-bis-(naphthoquinone-1,2-diazide-5-sulfonic acid ester) and the ester of a phenol-formaldehyde resin and naphthoquinone-1,2-diazide-5-sulfonic acid. Above all, naphthoquinone-1,2-diazide-5-sulfonic acid ester of the polyhydroxy-phenyl obtained by the polycondensation of acetone and pyrogallol described in U.S. Pat. No. 3,635,709 can be advantageously used.

The O-quinone diazide compound of the invention alone or in admixture with a resin is coated as a layer on a desired position onto a support to provide a light-sensitive organic coating layer. As the resin to be mixed with the O-quinone diazide compound, alkali-soluble resins, for example, phenol resins, cresol resins, styrene/maleic anhydride copolymers and shellac are suitable. Since a thinner light-sensitive organic coating layer in the light-sensitive copying material of the invention can be employed than the light-sensitive layer of single layer of the prior art, resins barely soluble in alkali solutions, which have hitherto not been mixed, for example, p-phenylphenol-formaldehyde resins, p-t-butylphenol-formaldehyde resins and polyvinyl butyral, can be used for the purpose of increasing the strength of an image area.

When the O-quinone diazide compound is used in admixture with one or more of these resins, it is desirable that the O-quinone diazide compound be present in an amount of at least about 20% by weight. If the content of O-quinone diazide is less than 20% by weight, a sufficient sensitivity and sharp image cannot be obtained.

A composition comprising an O-quinone diazide compound, which comprises the light-sensitive organic coating layer, is dissolved in a suitable solvent and coated. Examples of suitable solvents are ethylene glycol monoalkyl ethers such as ethylene glycol monomethyl ether and ethylene glycol monoethyl ether, their acetic acid esters such as ethylene glycol monomethyl ether acetate and ethylene glycol monoethyl ether acetate, ketones such as methyl ethyl ketone, methyl isobutyl ketone and cyclohexanone, butyl acetate, dioxane, pyridine and dimethylformamide.

The organic coating layer other than the light-sensitive organic coating layer used in the invention comprises a water-insoluble but organic solvent-soluble high molecular weight compound having film forming properties. In the layer structure of the first type as described above, furthermore, the light-non-sensitive layer is not dissolved in a developer more readily than the light-sensitive part of the first layer and should be permeable to the developer. For example, the light-non-sensitive layer can comprise a styrene/maleic anhydride copolymer, a styrene/acrylic acid copolymer, polyvinyl butyral, shellac or a soluble polyamide resin.

In the layer structure of the second type, the lower layer that is readily removed by a developer is protected by the upper non-exposed layer to provide an image. Thus, it is necessary that the lower layer be readily dissolved in a developer or swelled and stripped. For example, phenol-formaldehyde resins, cresol-formaldehyde resins, polyvinyl hydrogen phthalate and methacrylic acid/methyl methacrylate copolymers are suitable for this purpose. On the other hand, in the case of the third type as shown in FIG. 3, the stability of the image is better in development than in the first and second types and any resins suitable for the first type or for the second type can be used.

In any of the first, second and third types, each layer can be of not only one resin but also a mixture of various resins to control the dissolving or swelling properties in developers and the coating properties. Moreover, an O-quinone diazide compound can be added to these resins within a range which does not render them light-sensitive that is, the organic coating layer may be non-light sensitive.

If desired, various organic or inorganic additives can be incorporated in a suitable amount in the organic coating. For example, dyes (such as Crystal Violet and Oil Blue) in an amount of about 0.5 to 5% by weight, or pigments (such as Phthalocyanine Blue) in an amount of about 5 to 40% by weight can be added to color the coating, and fillers or plasticizers (such as titanium dioxide and clays) each in an amount of about 5 to 30%, can be added to increase the mechanical strength of the coating.

The dissolving, swelling and stripping properties of the light-insensitive layers of the first and second types depend upon the strength of the developer suitable for the light-sensitive layer used. As is well known in the art, the strength of a developer differs depending on the composition of the O-quinone diazide light-sensitive layer and, in general, a suitable range of developer strength which can be used broadens with the increase in the content of the O-quinone diazide light-sensitive layer. The strength of a developer can suitably be selected within this range. Therefore, the selection of a resin of the first type or second type need not be based on the degree of ordinary dissolving or swelling only and, on the other hand, styrene/maleic anhydride copolymers or styrene/acrylic acid copolymers can be used for any type by the selection of a light-sensitive composition.

The method of laminating the organic coatings according to the invention is ordinarily carried out by repeated coating of the layer components followed by drying, but, of course, various coating methods such as casting, transferring and simultaneous multi-layer coating can be used.

The thickness of each layer in the light-sensitive copying material according to the invention ranges, irrespective of the layer structure, from about 0.01 $g/m^2$ to 7.0 $g/m^2$, preferably from 0.02 $g/m^2$ to 5.0 $g/m^2$ on a dry basis, and the thickness of a light-sensitive organic coating layer comprising an O-quinone diazide compound is preferably 3.0 $g/m^2$ or less. Moreover, the sum of organic coating layers provided on a support is preferably 7.0 $g/m^2$ or less.

The light-sensitive copying material of the present invention is imagewise exposed to active rays such as radiation from a mercury lamp, xenon lamp or carbon arc lamp and then developed. While the exposure time and the amount of exposure can vary, a suitable exposure time can range from about 5 seconds to 5 minutes, preferably about 5 seconds to 1 minute. Suitable developers which can be used are alkali solutions, which have hitherto been known as developers for a light-sensitive layer of an O-quinone diazide compound, for example, aqueous solutions of inorganic alkalis such as sodium hydroxide, potassium hydroxide, sodium silicate, potassium silicate, sodium triphosphate, potassium triphosphate, sodium carbonate and potassium carbonate and basic solvents such as monoethanolamine, diethanolamine, propanolamine and morpholine. A suitable developer solution concentration can range from about 1 to 20% by weight, preferably 3 to 15% by weight. If desired, organic solvents and surface active agents can be added to these aqueous solutions. Where the wetting and permeation of the developer is reduced by the use of laminated organic coatings than the wetting and permeation of an O-quinone diazide light-sensitive layer alone, it is desirable to add a suitable amount of an organic solvent such as n-propyl alcohol or a surfactant such as sodium lauryl sulfate.

The light-sensitive copying material of the invention has an advantage that the strength of the image can be improved without increasing the thickness of the light-sensitive layer and, consequently, the amount of the O-quinone diazide can be reduced, resulting in obtaining a high sensitivity. Moreover, since an organic coating layer is provided in addition to a light-sensitive layer, the range of resins which can be selected for strengthening the image is broadened and a resin having a desirable properties can be selected depending on the end-use objects.

The light-sensitive copying material of the invention is applicable to various uses such as production of originals for overhead projectors and name plates in addition to the production of printing plates.

The following examples are given in order to illustrate the invention in greater detail without limiting the same. Unless otherwise, all parts, percents, ratios and the like are by weight.

EXAMPLE 1

1 part by weight of an ester of naphthoquinone-1,2-diazide-5-sulfonic acid and the polyhydroxy-phenyl obtained by the polycondensation of acetone and pyrogallol as described in Example 1 of U.S. Pat. No. 3,635,709 was dissolved in 100 parts by weight of ethylene glycol monomethyl ether and coated onto a grained aluminum sheet of a thickness of 0.3 mm in an amount of 25 ml per 1 $m^2$. After drying, the light-sensitive layer of O-quinone diazide compound had a thickness of about 0.25 $g/m^2$. The above described light-sensitive layer was confirmed to be barely soluble in a mixed solution of n-propyl alcohol and methyl alcohol (1:1 by volume). 8 parts by weight of a styrene-maleic acid anhydride copolymer (molar ratio 7:3; half ethyl ester; approximate molecular weight: 100,000) and 0.05 part by weight of a dye (Oil Blue, manufactured by Orient Kagaku Co., Ltd.) were dissolved in 100 parts by weight of the mixed alcohol solution and coated onto the resulting O-quinone diazide light-sensitive layer so as to give a thickness of 2.0 $g/m^2$ on a dry basis.

The so laminated light-sensitive plate was contacted tightly with a transparent positive image, exposed for 20 seconds to radiation from a carbon arc lamp light source (45 amp, 3 phase) at a distance of 70 cm and developed with a 3% by weight aqueous solution of sodium silicate. The exposed area was removed and a positive image corresponding to the original was obtained. It was found, from the condition of the image area colored with the dye, that the laminated first layer and second layer gave an image in combination. This plate was used as an offset printing plate in a conventional manner to thus obtain a very good print.

This good result was obtained with an exposure quantity of about half or less of that necessary for many commercially available light-sensitive printing plates using O-quinone diazide compounds.

EXAMPLE 2

The procedures of Example 1 were repeated except a shellac resin (manufactured by Nippon Shellac Kogyo Co., Ltd.) was used in place of the styrene-maleic acid copolymer, thus obtaining a light-sensitive plate. This plate was developed with 1% by weight aqueous solution of sodium silicate, gave a high sensitivity similar to Example 1 and had a sufficient properties that it could be used as an offset printing plate.

EXAMPLE 3

The procedures of Example 1 were repeated except a transparent polyethylene terephthalate film of a thickness of 0.1 mm was used in place of the grained aluminum sheet, thus obtaining a laminated light-sensitive plate. After developing, a transparent sheet having a blue image was obtained, which was suitable for use as an original for projection.

EXAMPLE 4

On the grained aluminum sheet similar to that of Example 1 was formed a first light-sensitive layer of an ester of naphthoquinone-1,2-diazide-5-sulfonic acid with polyhydroxyphenyl that is the condensation product of acetone and pyrogallol. 4 parts by weight of an alcohol-soluble nylon (Toray Amilan 4000 CM) was dissolved in 100 parts by weight of a mixed solution of n-propyl alcohol and methyl alcohol (1:1 by volume) and coated onto the above described O-quinone diazide light-sensitive layer to give a thickness of about 1.0 g/m$^2$ on dry basis, followed by drying. The so obtained light-sensitive plate was contacted tightly with a positive image, exposed imagewise for only 20 seconds to radiation from a carbon arc lamp light source (45 amp, 3 phase) through a distance of 70 cm and then developed with an aqueous solution containing 3% by weight of sodium silicate and 0.8% by weight of sodium lauryl sulfate. The resulting image was excellent in wear resistance as well as in resistance to scratching. When this plate was used as an offset printing plate, 50,000 or more good prints were obtained.

An attempt to mix the above described O-quinone diazide compound and nylon to form a single light-sensitive layer was not satisfactory, because they were not miscible and turbidity resulted.

EXAMPLE 5

In a manner similar to Example 4, on a grained aluminum sheet were formed a first light-sensitive layer of the O-quinone diazide compound in a thickness of about 0.25 g/m$^2$ and a second alcohol-soluble nylon layer in a thickness of about 1.0 g/m$^2$, thus obtaining a laminated light-sensitive plate. It was found that this light-sensitive plate was not dissolved by ethylene glycol monomethyl ether. Then 0.5 part by weight of the O-quinone diazide compound used in Example 1, 1.5 parts by weight of phenol-formaldehyde novolak resin and 0.02 part by weight of a dye (Oil Blue, manufactured by Orient Kagaku Co., Ltd.) were dissolved in 100 parts by weight of ethylene glycol monomethyl ether to prepare a third coating solution and coated onto the above described light-sensitive plate in a thickness of 0.5 g/m$^2$ on a dry basis followed by drying. The resulting light-sensitive plate of a three layer structure was used as a printing plate in a manner similar to Example 4. This printing plate had a tenacious image as well as a high printing resistance and the oil-sensitivity of the image was more improved than in the case of Example 4. A number of prints having a sufficient ink density were obtained except for the production several bad quality prints at the start of printing.

EXAMPLE 6

10 parts by weight of a methacrylic acid/methyl methacrylate copolymer (copolymerization molar ratio, 2/8; average molecular weight, about 70,000) and 0.1 part by weight of a dye (Oil Pink, manufactured by Orient Kagaku Co., Ltd.) were dissolved in 100 parts of ethylene glycol monomethyl ether and coated onto a grained aluminum sheet of 0.3 mm in a thickness in a proportion of 2.0 g/m$^2$ on a dry basis, followed by drying. Then 2 parts by weight of an ester of a cresol-formaldehyde novolak type resin and naphthoquinone-1,2-diazide-5-sulfonic acid were dissolved in 100 parts by weight of methylene dichloride and coated onto the above described layer of the methacrylic acid/methyl methacrylate copolymer and dye in a thickness of 0.5 g/m$^2$ on a dry basis, followed by drying. The so laminated light-sensitive plate was so sensitive that a difference in solubility on the upper layer of the light-sensitive plate by contacting tightly with a positive image and exposing imagewise to radiation for only 15 seconds to radiation from a carbon arc lamp light source (45 amp, 3 phase) at a distance of 70 cm occurred, and the exposed area was readily removed with an aqueous solution containing 3% by weight of sodium silicate. Since the methacrylic acid/methyl methacrylate copolymer of the first layer was an alkali-soluble polymer, moreover, the development was rapidly effected and an offset printing plate excellent in tone reproduction was obtained.

EXAMPLE 7

10 parts by weight of a phenol-formaldehyde novolak resin and 0.5 part by weight of an ester of naphthoquinone-1,2-diazide-5-sulfonic acid with polyhydroxy-phenyl that is the condensation product of acetone and pyrogallol, as used in Example 1, were dissolved in 100 parts by weight of ethylene glycol monomethyl ether acetate. The resulting solution was coated onto an aluminum plate of a thickness of 0.3 mm, subjected to a graining and an anodic oxidation treatment (15% by weight sulfuric acid; current density, 1.6 amp/dm$^2$; time, 2 minutes) to give a thickness of 2.1 g/m$^2$ on a dry basis, thus forming a first layer. Then 2 parts by weight of the phenol-formaldehyde resin used in the first layer and 5 parts by weight of 2,2'-dihydroxy-diphenyl-bis-(naphthoquinone-1,2-diazide-5-sulfonic acid ester) were dissolved in 150 parts of methylene dichloride and coated onto the above described first layer to give a coating quantity of 0.5 g/m$^2$ on a dry basis. Thereafter, treatment similar to that in Example 6 was carried out to form an image. The thus laminated light-sensitive plate had a high sensitivity as well as a good tone reproduction and was improved in development stability to a greater extent. Moreover, the sensitive plate had sufficient properties as an offset printing plate.

While the invention has been described in detail and with reference to specific embodiments thereof, it will be apparent to one skilled in the art that various changes and modifications can be made therein without departing from the spirit and scope thereof.

What is claimed is:

1. A light-sensitive material comprising a support having in order thereon a light-sensitive layer containing 20 to 100% by weight of an o-quinone diazide compound, the solubility of said compound being increased in alkaline solution upon irradiation with active light rays, said light-sensitive layer being coated directly on said support, and a non-light sensitive organic coating layer, said organic coating layer comprising a water-insoluble but organic solvent soluble high molecular weight compound, selected from the group consisting of styrene/maleic anhydride copolymer, styrene/acrylic acid copolymer, polyvinyl butyral, shellac and polyamide resin, having film forming properties, said organic coating layer being water insoluble and barely soluble in alkaline solution, but permeable to alkaline solution, the exposed portion of said light-sensitive layer being completely removed by alkaline solution development along with superimposed corresponding co-extensive exposed portion of the organic coating layer by the alkaline developer, which comprises an aqueous solution of an inorganic alkali or a basic solvent, the concentration of said developer in said developer's solution being from 1 to 20%, permeating the organic coating layer and dissolving the exposed portion of the light-sensitive layer, thereby forming an image of unexposed light-sensitive layer superimposed by corresponding coextensive unexposed portion of organic coating layer, the thickness of each of said layers being from about 0.01 g/m$^2$ to 0.7 g/m$^2$.

2. The light-sensitive copying material of claim 1, wherein said light-sensitive layer comprises said o-quinone diazide compound and an organic resin which is alkali soluble or barely soluble in alkali solution.

3. The light-sensitive copying material of claim 2, wherein said organic resin is a phenol resin, a cresol resin, a styrene/maleic anhydride copolymer or shellac.

4. The light-sensitive copying material of claim 1 wherein said support is a metal sheet, a resin film, a paper, a resin film-paper laminate, or a glass sheet.

5. The light-sensitive copying material of claim 4, wherein the surface of said support is hydrophilic.

6. The light-sensitive copying material of claim 5, wherein said support is an aluminum sheet.

7. The light-sensitive copying material of claim 1, wherein said O-quinone diazide compound is an ester of an aromatic polyhydroxy compound and an O-quinone diazide sulfonic acid.

8. The light-sensitive copying material of claim 7, wherein said O-quinone diazide compound is 2,2'-dihydroxydiphenyl-bis-(naphthoquinone-1,2-diazide-5-sulfonic acid ester), 2,3,4-trioxybenzophenone-bis-(naphthoquinone-1,2-diazide-5-sulfonic acid ester), 2,7-dihydroxynaphthalene-bis-(naphthoquinone-1,2-diazide-5-sulfonic acid ester), the ester of a phenol-formaldehyde resin and naphthoquinone-1,2-diazide-5-sulfonic acid, or the naphthoquinone-1,2-diazide-5-sulfonic acid ester of the polyhydroxyphenyl obtained by the condensation of acetone and pyrogallol.

9. The light-sensitive copying material of claim 1, wherein the combined thickness of said at least two coating layers is 7.0 g/m$^2$ or less.

* * * * *